(12) United States Patent
Kawanishi et al.

(10) Patent No.: US 8,980,755 B2
(45) Date of Patent: Mar. 17, 2015

(54) METHOD OF PATTERN FORMATION (71) Applicant: Kabushiki Kaisha Toshiba, Tokyo (JP)

(72) Inventors: Ayako Kawanishi, Kanagawa (JP); Tsukasa Azuma, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 13/784,637

(22) Filed: Mar. 4, 2013

(65) Prior Publication Data
US 2014/0065839 A1    Mar. 6, 2014

(30) Foreign Application Priority Data

Sep. 5, 2012   (JP) ................. P2012-194960

(51) Int. Cl.
*H01L 21/311*    (2006.01)
*H01L 21/027*    (2006.01)

(52) U.S. Cl.
CPC ............... *H01L 21/0271* (2013.01)
USPC ..................... 438/702; 438/703

(58) Field of Classification Search
USPC ........................ 438/702, 703, 696
See application file for complete search history.

(56) References Cited

U.S. PATENT DOCUMENTS

| 8,114,300 B2 | 2/2012 | Millward |
| 2008/0217292 A1 | 9/2008 | Millward et al. |
| 2008/0286659 A1* | 11/2008 | Millward ............ 430/5 |
| 2010/0297847 A1 | 11/2010 | Cheng et al. |
| 2011/0034029 A1 | 2/2011 | Matsunaga et al. |
| 2012/0223052 A1 | 9/2012 | Regner |

FOREIGN PATENT DOCUMENTS

| JP | 2010-056256 A | 3/2010 |
| JP | 2010269304 | 12/2010 |
| JP | 2011-077475 A | 4/2011 |

* cited by examiner

*Primary Examiner* — Reema Patel
(74) *Attorney, Agent, or Firm* — Patterson & Sheridan, LLP (57) ABSTRACT

According to the embodiments, a method for pattern formation includes: creating a first self-assembly material layer which contains a first segment and a second segment, on a substrate on which a guide layer is installed; creating a first self-assembled pattern in which the first self-assembly material layer is phase-separated, the pattern including a first area containing the first segment and a second area containing the second segment; creating a second self-assembly material layer which includes a third segment and a fourth segment, in the first self-assembled pattern; creating a second self-assembled pattern in which the second self-assembly material layer is phase-separated, and which includes a third area containing the third segment and a fourth area containing the fourth segment.

15 Claims, 10 Drawing Sheets

METHOD OF PATTERN FORMATION

CROSS-REFERENCE TO RELATED APPLICATION

This application is based upon and claims the benefit of priority from Japanese Patent Application No. 2012-194960, filed Sep. 5, 2012; the entire contents of which are incorporated herein by reference.

FIELD

Embodiments described herein relate generally to a pattern formation method.

BACKGROUND

Conventional lithography technology for manufacturing semiconductor devices includes double patterning technology by ArF liquid immersion exposure, EUV lithography, and nanoimprint. The conventional lithographic technique suffers various problems such as increase in cost, reduction in throughput, with miniaturization of the pattern.

Under such circumstances, application of self-assembly (DSA: Directed Self-Assembly) to lithography has been explored. Since self-assembly occurs due to the spontaneous behavior called stable energy, and a pattern with high dimensional accuracy can be formed. In particular, periodic structures of various shapes of several nanometers (nm) to 100 nm can be formed by using a micro phase separation of the high molecular block copolymer with a simple application and annealing process. The shape is changed to spherical (sphere), columnar (cylinder), layered (lamella), depending on the composition ratio of the high molecular block copolymer. By changing the size depending on the molecular weight, a pattern such as, dot pattern, holes or pillar pattern, line, of various dimensions can be formed.

In order to form a desired pattern in wide range using DSA, it is necessary to form a guide structure which controls the genesis location of the polymer phase formed by self-assembly. As the guide structure, a structure having depressed portions and projected portions is used; and a physical guide (grapho-epitaxy) forming a micro phase separation pattern at the depressed portion, and a chemical guide (chemical-epitaxy) which controls the position of micro phase separation pattern based on the difference between the surface energy of patterns, which are formed at the lower layer of the DSA material, are known.

When forming the micro phase separation pattern by using such type of guide, by applying self assembled material on a surface energy controlled base film, the effect of the surface energy in the region separated from the base film is low and the self assembled material does not phase separate periodically (regular) in a uniform manner. This happens because the periodic phase separation is in a metastable state and if energy is not received from the surroundings, the self assembled material becomes separated randomly. Due to this, conventionally, at the time of formation of regular micro phase separate pattern, the film of the self assembled material is made sufficiently thin so that the effect of the surface energy of the base film is dispersed. However, sufficient fabrication tolerance is not obtained in the micro phase separation pattern of such thin films

DETAILED DESCRIPTION

Embodiments provide a pattern formation method by which regular phase separation of self assembled material having a greater film thickness than in the related art is possible.

In general, embodiments are explained by using the figures.

According to the embodiments, a method for pattern formation is provided with a process of creating a first self-assembly material layer which contains a first segment and a second segment, on a substrate on which a guide layer is installed; process of creating a first self-assembled pattern in which the first self-assembly material layer is phase-separated, the pattern including a first area containing the first segment and a second area containing the second segment; process of creating a second self-assembly material layer which includes a third segment and a fourth segment, in the first self-assembled pattern; process of creating a second self-assembled pattern in which the second self-assembly material layer is phase-separated, and which includes a third area containing the third segment and a fourth area containing the fourth segment.

First Embodiment

The pattern forming method described in a first embodiment is explained with referring to FIG. 1 to FIG. 8.

Figure 1:
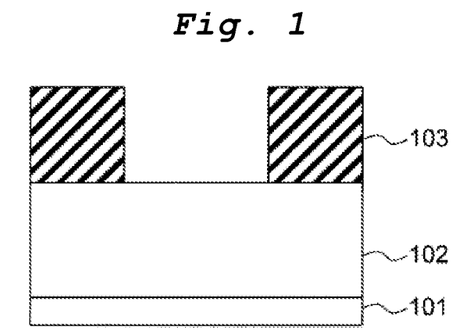
FIG. 1 is a cross-sectional view for explaining a process of a pattern forming method according to a first embodiment.

First of all, as shown in FIG. 1, a silicon oxide film (for instance, in this case, $SiO_2$) having 300 nanometer (nm) film thickness is prepared by using CVD and a work film 102 is formed on a substrate 101. Further, a resist film 103 having 100 nm film thickness, is coated by spin coating method. It is exposed and developed by the ArF excimer laser, and is processed into a line-and-space pattern with 175 nm half-pitch. Although it is not shown in the figure, it is possible to form an anti-reflection film in between the layer of the resist film 103 and the work film 102 at this time. FIG. 1 shows a portion of the line-and-space pattern. When the micro phase separation is done for the block copolymer formed in a later process, this line-and-space pattern has a function of a physical guide layer which controls a position of the pattern forming micro phase separation.

Figure 2:
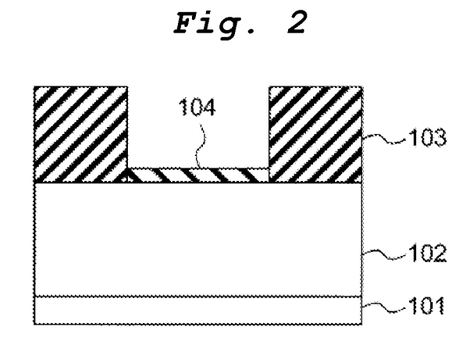
FIG. 2 is a cross-sectional view for explaining the process continued from FIG. 1.

Further, as shown in FIG. 2, a block copolymer layer 104 is formed in a concave portion of the resist pattern 103. For instance, polyethylene glycol mono-methyl ether acetate (PGMEA) (first solution) containing block copolymer (PS-b-PMMA) of polystyrene (PS) (first segment) and poly-methyl methacrylate (PMMA) (second segment) having 2.0 wt % concentration, is spin coated with 2,000 rpm of rotation frequency by which the block copolymer layer 104 having film thickness of 20 nm is formed. The block copolymer layer 104 formed here has a film thickness to the extent by which phase separation of the entire layer can be done regularly.

Figure 3:
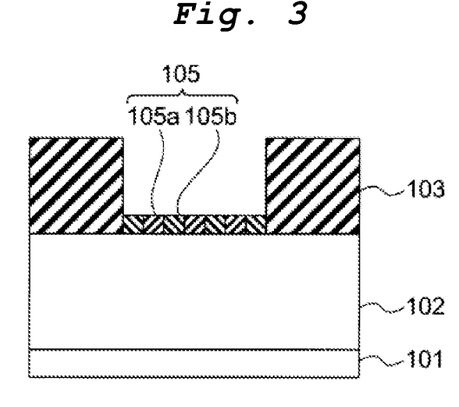
FIG. 3 is a cross-sectional view for explaining the process continued from FIG. 2.

Further, as shown in FIG. 3, the substrate 101 is placed on a hot plate and heated for about 90 seconds at 250° C. According to this, the block copolymer layer 104 forms a lamella shaped (layered) self assembly pattern 105 by providing an alternating laminated first polymer 105a having a first polymer block chain and a laminated second polymer 105b having a second polymer block chain. For instance, the lamella shaped self assembly pattern 105 having 25 nm of half pitch is formed. Since the block copolymer layer 104 formed in the process shown in FIG. 2 has thin film thickness, in the process shown in FIG. 3, the entire block copolymer layer 104 is micro phase separated regularly by which the self assembly pattern 105 is obtained.

Figure 4:
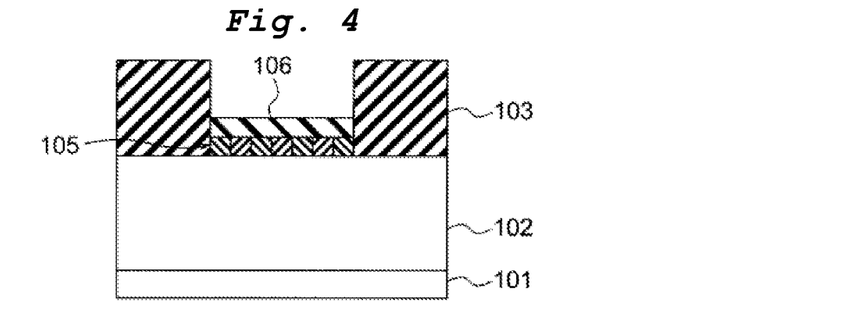
FIG. 4 is a cross-sectional view for explaining the process continued from FIG. 3.

Further, as shown in FIG. 4, a block copolymer layer 106 is formed on the self assembly pattern 105 in the concave part of the resist pattern 103. For instance, polyethylene glycol mono-methyl ether acetate (PGMEA) (second solution) containing block copolymer (PS-b-PMMA) of polystyrene (PS) and poly-methyl methacrylate (PMMA) having 2.0 wt % concentration, is spin coated with 2,000 rpm of rotation frequency by which the block copolymer layer 106 having film thickness of 20 nm is formed.

Figure 5:
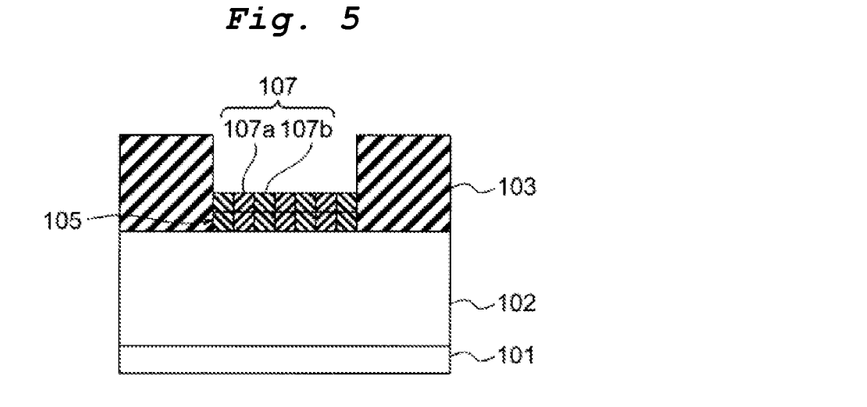
FIG. 5 is a cross-sectional view for explaining the process continued from FIG. 4.

Further, as shown in FIG. 5, the substrate 101 is placed on a hot plate and heated for about 90 seconds at 250° C. According to this, the block copolymer layer 106 forms a lamella shaped self assembly pattern 107 by providing an alternating laminated first polymer 107a having the first polymer block chain and a laminated second polymer 107b having the second polymer block chain. For instance, the lamella shaped self assembly pattern 107 having 25 nm of half pitch is formed. Since the block copolymer layer 106 formed in the process shown in FIG. 4 has small film thickness, in the process shown in FIG. 5, the entire block copolymer layer 106 is micro phase separated regularly by which the self assembly pattern 107 is obtained.

The self assembly pattern 107 has pattern similar to the self assembly pattern 105. For that, the micro phase separating pattern of 40 nm (=20 nm+20 nm) of film thickness can be obtained according to the process shown in FIG. 1 to FIG. 5.

Figure 6:
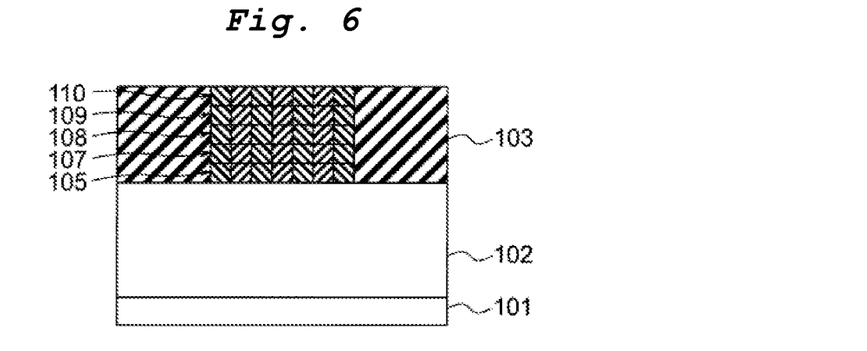
FIG. 6 is a cross-sectional view for explaining the process continued from FIG. 5.

Further, process shown in FIG. 4 and FIG. 5 are repeated 3 times and self assembly patterns 108 to 110 are formed sequentially on the self assembly pattern 107. Therefore, as shown in FIG. 6, it is possible to form the micro phase separation pattern having film thickness of 100 nm (=20 nm×5) in the concave part of the resist pattern 103.

Further, at the time of coating the PGMEA solution of block copolymer on the self assembly pattern 105, the phase separation pattern of self assembly pattern 105 is dissolved due to the application of a solvent (for instance, in this case, PGMEA). Such problems can be prevented by using a solvent other than the first solution coated by the process shown in FIG. 2 and second solution coated by the process shown in FIG. 4. Or, a cross-linking agent (thermal cross-linking agent) is added in the first solution, cross-linking is done after forming the phase separation pattern of the self assembly pattern 105. After that, second solution is coated. In this way also causing of problem can be prevented. Changing the solution type or adding the cross-linking agent into the solution is not restricted to the first solution or second solution. It can also be applied at the time of repetitive coating of the block copolymer solution in post process.

Figure 7:
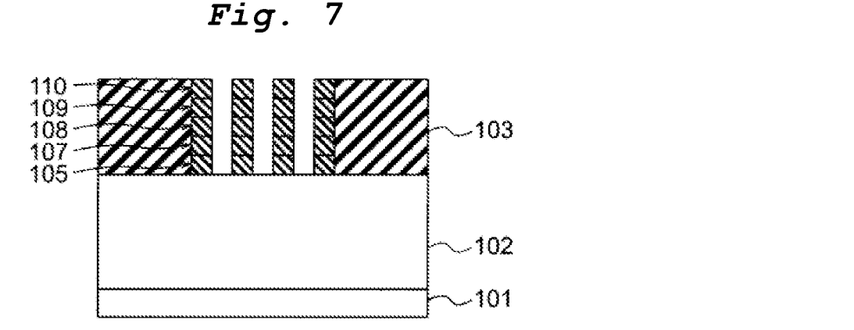
FIG. 7 is a cross-sectional view for explaining the process continued from FIG. 6.

Further, as shown in FIG. 7, anyone (for instance, first polymer includes PMMA) of the first polymer and second polymer exists in self assembly patterns 105, 107 to 110 is selectively removed by the processing procedure and line and the space pattern with high aspect ratio is obtained.

Figure 8:
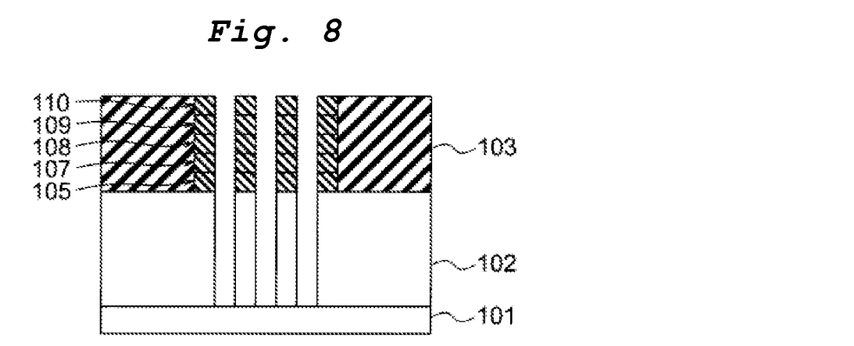
FIG. 8 is a cross-sectional view for explaining the process continued from FIG. 7.

After that, as shown in FIG. 8, any one (for instance, second polymer includes PS) of the first polymer and second polymer remaining in self assembly patterns 105, 107 to 110 and resist 103 are used as a mask and the processed film 102 is processed.

In this way, the embodiment formation of the block copolymer layer having thin film thickness and micro phase separation of block copolymer layer are repeated several times in the physical guide by which micro phase separation pattern having large film thickness can be formed. Since the film thickness of the micro phase separation pattern is large, sufficient process resistance characteristics can be obtained at the time of processing the processed film.

In the first embodiment, the resist pattern which becomes a physical guide is formed by exposing and developing by using the ArF excimer laser. However, the physical guide can also be formed by the ArF liquid immersion exposure, photo-lithography such as EUV, nanoimprint. Moreover, the physical guide can also be formed by transferring the resist pattern into the processed film. Moreover, if necessary, surface treatment is executed for the physical guide and the chemical guide can be formed on the irregular pattern of the physical guide.

Second Embodiment

Method of pattern formation according to a second embodiment is explained by using FIG. 9 to FIG. 19.

Figure 9:
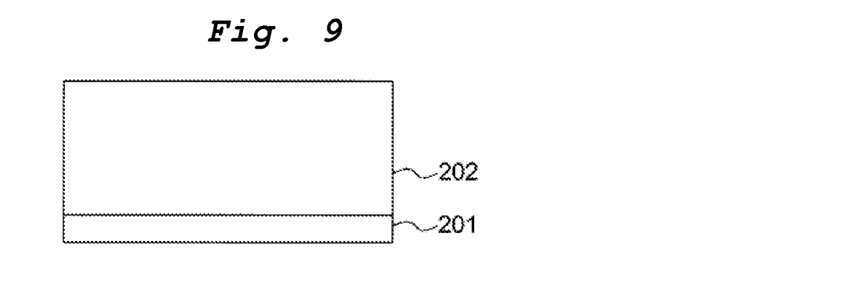
FIG. 9 is a cross-sectional view for explaining a process of a pattern forming method according to a second embodiment.

First of all, as shown in FIG. 9, the $SiO_2$ film having 300 nm of film thickness is prepared by using CVD and a processed film 202 is formed on a substrate 201.

Figure 10:
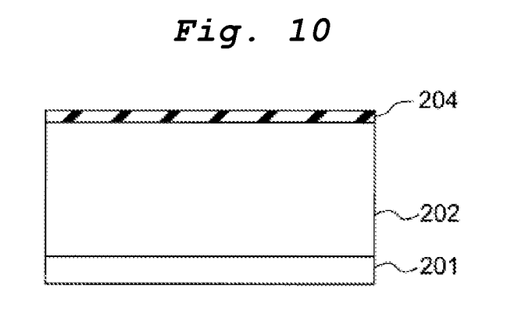
FIG. 10 is a cross-sectional view for explaining the process continued from FIG. 9.

Further, a neutralized film 204 is formed on the processed film 202 as shown in FIG. 10. For instance, the polyethylene glycol mono-methyl ether acetate (PGMEA) solution containing the random copolymer (PS-r-PMMA) of polystyrene (PS) and poly-methyl methacrylate (PMMA) with 1.0 wt % concentration, is spin coated on the processed film 202 at 2,000 rpm of rotation frequency. This solution is placed on the hot plate and heated for 90 seconds at 110° C. and for 3 minutes at 240° C. and thus the neutralized film 204 is formed.

Figure 11:
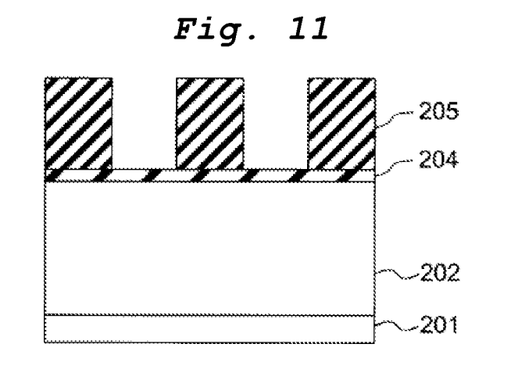
FIG. 11 is a cross-sectional view for explaining the process continued from FIG. 10.

Further, as shown in FIG. 11, a resist 205 having 100 nm of film thickness is spin coated, it is exposed and developed by the ArF excimer laser and processed in the line and space pattern having 45 nm of width. At this time, an anti-reflection film may be formed between the layers of neutralized film 204 and the processed film 202 although it is not shown in the figure.

Figure 12:
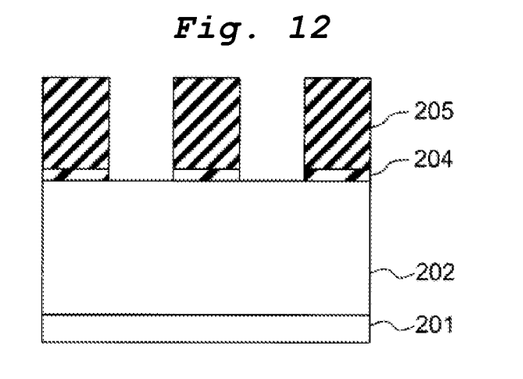
FIG. 12 is a cross-sectional view for explaining the process continued from FIG. 11.

As shown in FIG. 12, the resist 205 is used as a mask, and a portion of the neutralized film 204 is etched by reactive etching (RIE) in the presence of oxygen plasma. As a result, the form of the resist pattern is transcribed in the neutralized film 204.

Figure 13:
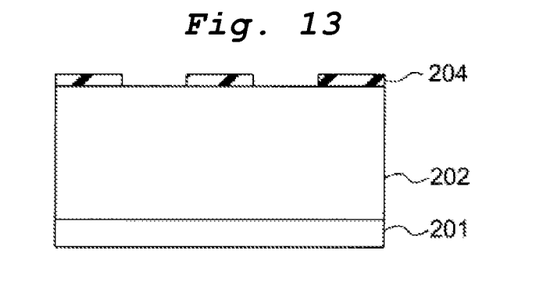
FIG. 13 is a cross-sectional view for explaining the process continued from FIG. 12.

Further, as shown in FIG. 13, the resist 205 is peeled off. A foundation layer including the neutralized layer 204 and processed layer 202 is thus obtained. When the block copolymer formed in subsequent processing is micro phase separated, this foundation layer has function which is used as the chemical guide layer which controls the position of forming the micro phase separation pattern. The block copolymer has the first segment and the second segment. In any one of the neutralized film 204 and the processed film 202, an interfacial force (tension) of the first segment is same as the interfacial force of the second segment. In the other film(s), the interfacial force of the first segment and the interfacial force of the second segment are different.

Figure 14:
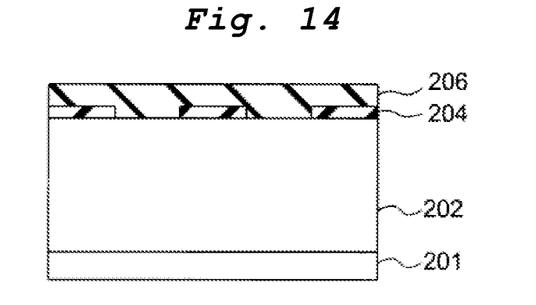
FIG. 14 is a cross-sectional view for explaining the process continued from FIG. 13.

Further, as shown in FIG. 14, a block copolymer layer 206 is formed on a basic chemical guide layer by coating the block copolymer. For instance, the block copolymer where the first polymer block chain and the second polymer block chain are coupled is used as a block copolymer to be coated. For instance, the block copolymer (PS-b-PMMA) of polystyrene (PS) and poly-methyl methacrylate (PMMA) can be used as diblock copolymer. For instance, PGMEA solution (third solution) having this diblock copolymer with 1.0 wt % of concentration is spin coated on the foundation layer (portions of neutralized layer 204 and processed layer 202) at 2,000 rpm of rotation frequency and the block copolymer layer 206 having 20 nm of film thickness is formed.

Further, it is assumed that the block copolymer layer 206 formed here has such a thickness so that phase dissociation of the entire block copolymer layer 206 is periodically (regularly) caused by the effect of surface energy of the foundation layer.

Figure 15:
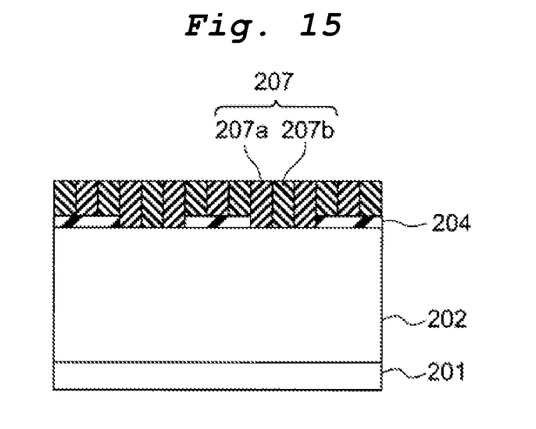
FIG. 15 is a cross-sectional view for explaining the process continued from FIG. 14.

Then, as shown in FIG. 15, the substrate 201 is kept on the hot plate and heated at 110° C. for 90 seconds. In addition, it is heated under a nitrogen atmosphere at 250° C. for 3 minutes. By doing so, a lamellar self-assembled pattern 207, in which a first lamellar polymer part 207a containing the first polymer block chain and the second lamellar polymer part 207b containing the second polymer block chain are mutually arranged in alternating layers, is formed for the block copolymer layer 206. For example, the lamellar self-assembled pattern 207 of half pitch 15 nm is formed. As the thickness of block copolymer layer 206 formed in the process shown in FIG. 14 is small, micro phase dissociation of the entire block copolymer layer 206 takes place by the process shown in FIG. 15 and the self-assembled pattern 207 can be obtained.

Figure 16:
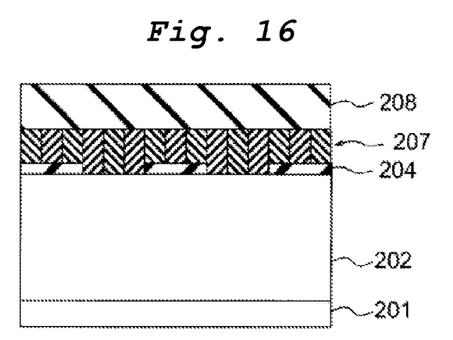
FIG. 16 is a cross-sectional view for explaining the process continued from FIG. 15.

Next, as shown in FIG. 16, a block copolymer layer 208 is formed on the self-assembled pattern 207. For instance, similar to the block copolymer layer 206, PGMEA solution (fourth solution) containing 1.0 wt % concentration of block copolymer (PS-b-PMMA) of polystyrene (PS) and poly-methyl methacrylate (PMMA) is spin coated at rotational frequency of 2,000 rpm and the block copolymer layer 208 of thickness 20 nm is formed.

Figure 17:
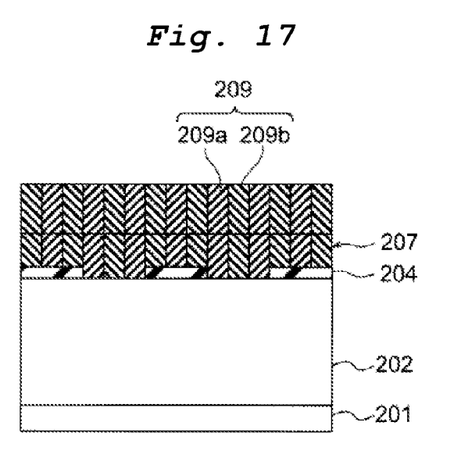
FIG. 17 is a cross-sectional view for explaining the process continued from FIG. 16.

Then, as shown in FIG. 17, the substrate 201 is kept on the hot plate and heated at 110° C. for 90 seconds. In addition, it is heated under a nitrogen atmosphere at 250° C. for 3 minutes. By doing so, a lamellar self-assembled pattern 209, in which a first lamellar polymer part 209a containing the first polymer block chain and a second lamellar polymer part 209b containing the second polymer block chain are mutually arranged in alternating layers, is formed for the block copolymer layer 208. For instance, the lamellar self-assembled pattern 209 of half pitch 15 nm is formed. As the thickness of the block copolymer layer 208 formed in the process shown in FIG. 16 is small, micro phase dissociation of the entire block copolymer layer 208 takes place by the process shown in FIG. 17 and the self-assembled pattern 209 can be obtained.

The self-assembled pattern 209 has similar pattern to the self-assembled pattern 207 due to the influence of the self-assembled pattern 207. Therefore, micro phase dissociation pattern of thickness 40 nm (=20 nm+20 nm) can be obtained by the processes shown in FIG. 9 to FIG. 17.

Figure 18:
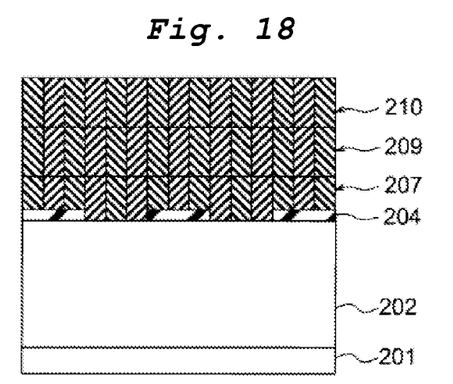
FIG. 18 is a cross-sectional view for explaining the process continued from FIG. 17.

By repeating the processes shown in FIG. 16 and FIG. 17 once, a self-assembled pattern 210 having pattern similar to the self-assembled pattern 209 is formed on the self-assembled pattern 209. Thus, micro phase dissociation pattern of thickness 60 nm (=20 nm×3) can be formed as shown in FIG. 18.

Further, in the process shown in FIG. 16, while applying the PGMEA solution (fourth solution) of block copolymer on the self-assembled pattern 207, it is possible that the phase dissociation pattern of the self-assembled pattern 207 is dissolved by the solvent (for instance, in this case, PGMEA). This problem can be solved by using the solvent type different from the third solution and the fourth solution that are applied in the process shown in FIG. 14. Further, the cross linking agent is added in the third solution and phase dissociation pattern of the self-assembled pattern 207 is formed. After that, it is cross linked and then, the fourth solution is applied. The problem mentioned above can even be solved by doing the above process. Whether to change the type of solvent or to add the cross linking agent in the solution is not limited to the third solution and the fourth solution, but can be used as needed in the further processes also while repeatedly applying the solution of block copolymer.

Figure 19:
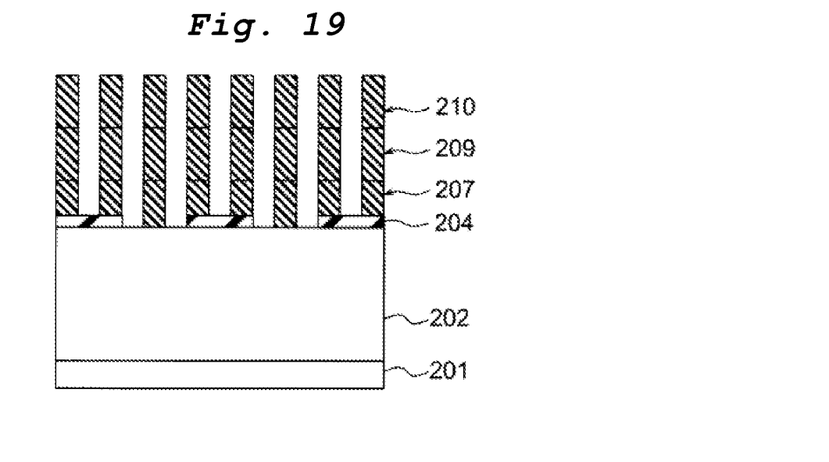
FIG. 19 is a cross-sectional view for explaining the process continued from FIG. 18.

Next, as shown in FIG. 19, as per the processing procedure, either of the first polymer or the second polymer (for instance, the first polymer including PMMA) in the self-assembled patterns 207, 209, and 210 is selectively removed and due to this, the line and space pattern of high aspect ratio can be obtained.

After that, the remaining of one of the first polymer or the second polymer (for instance, the second polymer including PS) in the self-assembled patterns 207, 209, and 210 is processed as mask in the processed film 202.

In this way, in this embodiment, micro phase dissociation pattern having more thickness can be formed by conducting multiple repetitions of formation of thin layer of block copolymer and micro phase dissociation of block copolymer layer on the chemical guide. Since the thickness of micro phase dissociation pattern is more, sufficient processing resistance can be obtained at the time of processing the processed film.

In the first and second embodiments mentioned above, the number of repetitions of formation of thin layer of block copolymer and micro phase dissociation of block copolymer layer can be two times or more.

In the first and second embodiments mentioned above, though the lower layer micro phase dissociation pattern and the upper layer micro phase dissociation pattern are patterns of similar form, the lower layer micro phase dissociation pattern is used as the chemical guide layer and a micro phase dissociation pattern having narrow pitch can be formed in addition on the upper layer.

Figure 20:
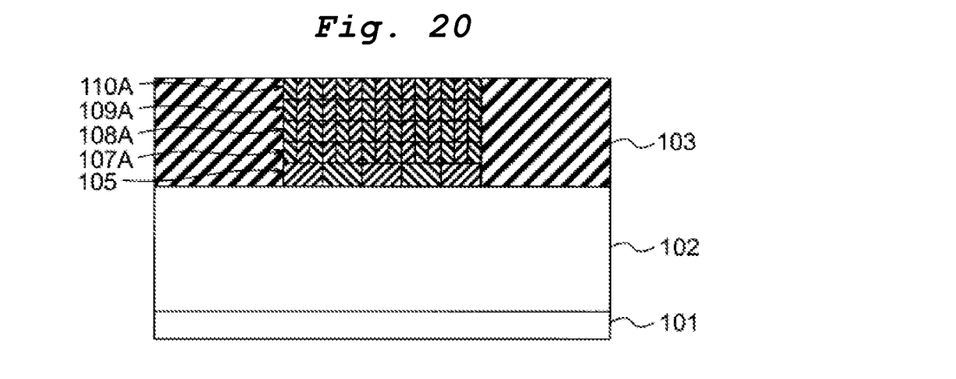
FIG. 20 is a cross-sectional view for explaining a process of a pattern forming method according to a modified example.

For instance, in the first embodiments mentioned above, as shown in FIG. 20, the self-assembled pattern 105 as the chemical guide, and the self-assembled pattern 107A having narrow pitch than the self-assembled pattern 105 is formed. Then, the self-assembled patterns 108A to 110A, having pattern formation similar to the self-assembled pattern 107A, are sequentially formed on the self-assembled pattern 107A. The pitch of self-assembled pattern 105 is n times (n is an integer greater than 2) a pitch of the self-assembled patterns 107A to 110A. After that, either of the first polymer or the second polymer of the self-assembled patterns 107A to 110A, are selectively removed, and the other remaining first polymer and the second polymer of the self-assembled patterns 107A to 110A are masked in the self-assembled pattern 105 and the processed film 102 and then processed.

Figure 21:
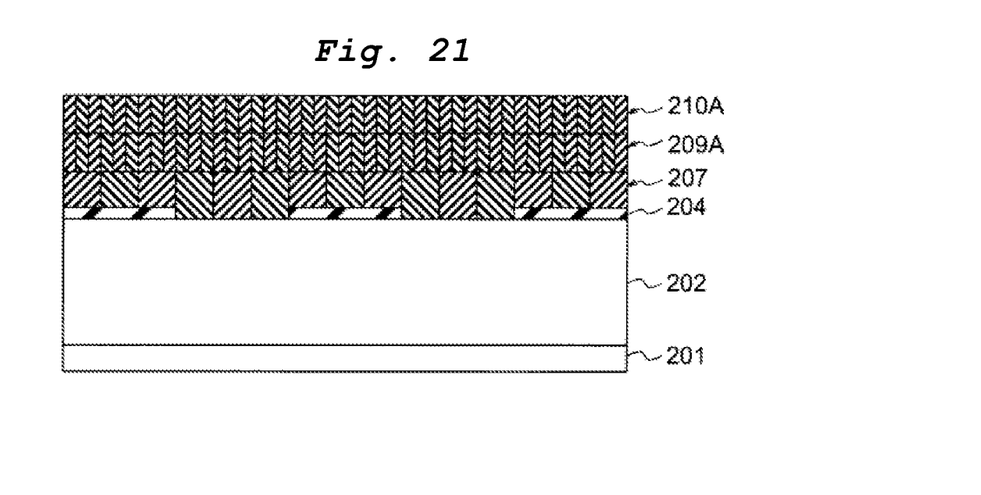
FIG. 21 is a cross-sectional view for explaining the process of the pattern forming method of the modified example.

Further, for instance, in the second embodiment mentioned above, as shown in the FIG. 21, the self-assembled pattern 207 as the chemical guide and the self-assembled pattern 209A having a narrower pitch than the self-assembled pattern 207 is formed. Then, the self-assembled pattern 210A, having pattern formation similar to the self-assembled pattern 209A, is formed on the self-assembled pattern 209A. The pitch of self-assembled pattern 207 is n times (n is integer greater than 2) of pitch of the self-assembled patterns 209A and 210A. After that, either of the first polymer or the second polymer of the self-assembled patterns 209A, 210A, is selectively removed, or the other remaining first polymer and the second polymer of the self-assembled patterns 209A, 210A are masked in the self-assembled pattern 207 and the processed film 202 and then processed.

In this way, the self-assembled pattern of lower layer is used as the chemical guide, and likewise, micro phase dissociation pattern of high aspect ratio can be formed.

Figure 22:
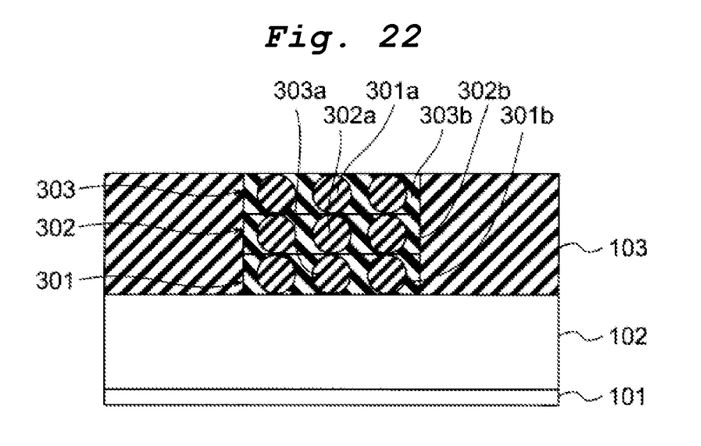
FIG. 22 is a cross-sectional view explaining the process of the pattern forming method of the modified example.

In the first and second embodiments mentioned above, the lamellar pattern is formed from micro phase dissociation, but the sphere shaped or cylindrical patterns can also be formed by changing the composition ratio of the first polymer block chain and second polymer block chain of diblock copolymer. For instance, as shown in FIG. 22, multiple layered pattern of micro phase separated self-assembled patterns 301 to 303 can be obtained in cylindrical shape by changing the material of block copolymer, using the method similar to the first embodiment. The self-assembled patterns 301 to 303 have first polymers 301a to 303a and second polymers 301b to 303b containing first polymers 301a to 303a in cylindrical shape.

Figure 23:
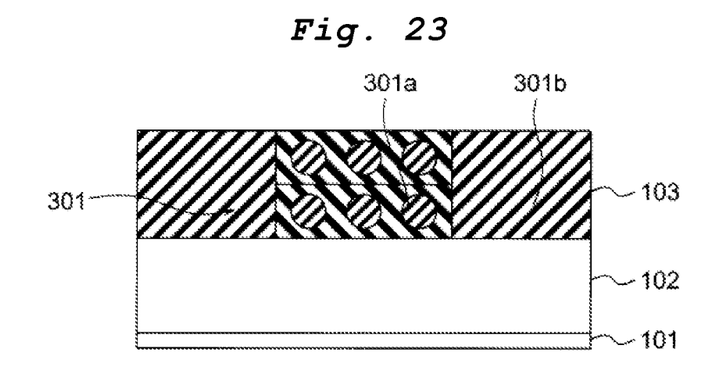
FIG. 23 is a cross-sectional view for explaining a process of a pattern forming method according to a comparative example.

Here, the block copolymer layer is formed in such a way that the thickness of each of the self-assembled patterns 301 to 303 is equal to the radius of the first polymers 301a to 303a of cylindrical shape. If the thickness of block copolymer layer is more than the radius of the first polymers 301a to 303a of cylindrical shape, then the second polymer 301b is formed on the up and down of the first polymer 301a, as shown in FIG. 23; because it is difficult to carry out the selective removal of the first polymer 301a.

This is also same in case of forming the multiple layered pattern of micro phase separated self-assembled pattern in sphere shape. The block copolymer layer is formed in such a way that it is equal to the radius of polymer part of sphere shape.

Third Embodiment

A pattern formation method according to a third embodiment is explained by using FIG. 24 to FIG. 29.

Figure 24:
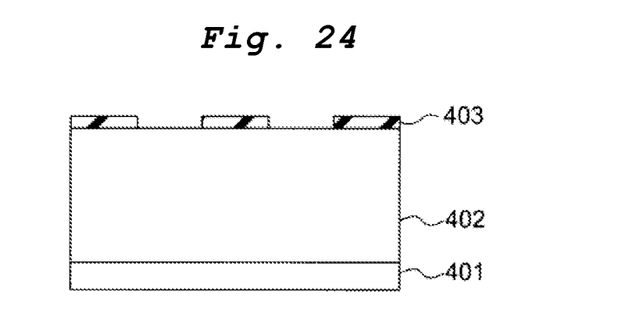
FIG. 24 is a cross-sectional view for explaining a process of a pattern forming method according to a third embodiment.

First of all, as shown in FIG. 24, a foundation layer including a processed film 402 and a neutralized coat 403 is formed on a substrate 401. The process of formation of this foundation layer is similar to the second embodiment as shown in FIG. 9 to FIG. 13. Therefore, its detailed explanation is omitted. This foundation layer functions as the chemical guide which controls the location of formation of micro phase dissociation pattern when the block copolymer formed in the later process is micro phase separated.

Figure 25:
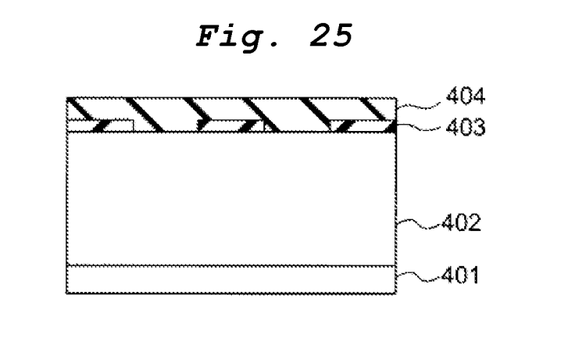
FIG. 25 is a cross-sectional view for explaining the process continued from FIG. 24.

Then, as shown in FIG. 25, a block copolymer layer 404 is formed on the chemical guide layer of the foundation layer by applying the block copolymer. As for the block copolymer to be applied diblock copolymer, for instance, the one in which, the first polymer block chain and the second polymer block chain are combined, is used. The block copolymer can be used as diblock copolymer. For instance, the block copolymer (PS-b-PMMA) of polystyrene (PS) and poly-methyl methacrylate (PMMA) can be used. For example, PGMEA solution (fifth solution) containing thermal cross-linking material having 1.0 wt % concentration of this diblock copolymer is spin coated at rotational frequency of 2,000 rpm and the block copolymer layer 404 of thickness 20 nm is formed on the foundation layer.

Further, the block copolymer layer 404 formed here has such a thickness so that phase dissociation of the entire block copolymer layer 404 is periodically (regularly) caused by the effect of surface energy of the foundation layer.

Figure 26:
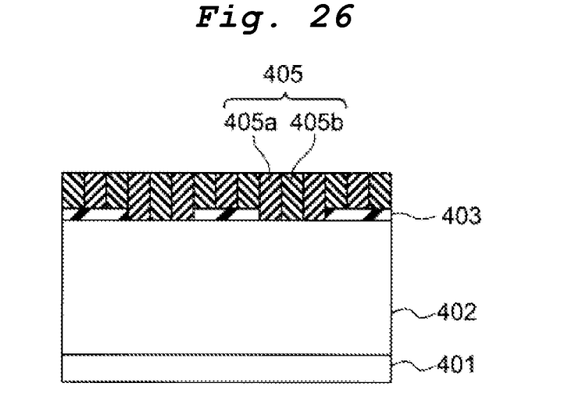
FIG. 26 is a cross-sectional view for explaining the process continued from FIG. 25.

Then, as shown in FIG. 26, the substrate 201 is kept on the hot plate and heated at 250° C. for 3 minutes. By doing so, the block copolymer layer 404 is turned in the form of a lamellar self-assembled pattern 405 in which thin plate shaped a first polymer 405a containing the first polymer block chain and a second polymer 405b containing the second polymer block chain are mutually placed. For instance, the lamellar self-assembled pattern 405 of half pitch 15 nm is formed. The thickness of block copolymer 404 formed in the process shown in FIG. 25 is small. Therefore, micro phase dissociation of the entire block copolymer 404 is done regularly in the process shown in FIG. 26, and the self-assembled pattern 405 can be obtained.

Figure 27:
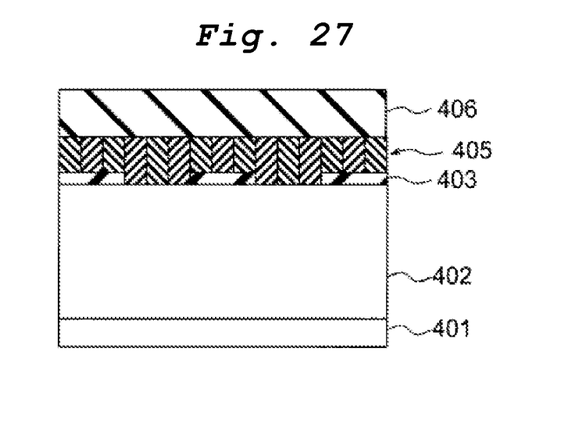
FIG. 27 is a cross-sectional view for explaining the process continued from FIG. 26.

Then, as shown in FIG. 27, a blended polymer layer 406 is formed on the self-assembled pattern 405. For instance, homopolymer of polystyrene (PS) and homopolymer of polydimethylsiloxane (PDMS) are mixed and PGMEA solution (sixth solution) containing thermal cross-linking material having 1.0 wt % concentration of this polymer mixture is spin coated at rotational frequency of 2,500 rpm to form the blended polymer layer 406 of thickness 10 nm.

Figure 28:
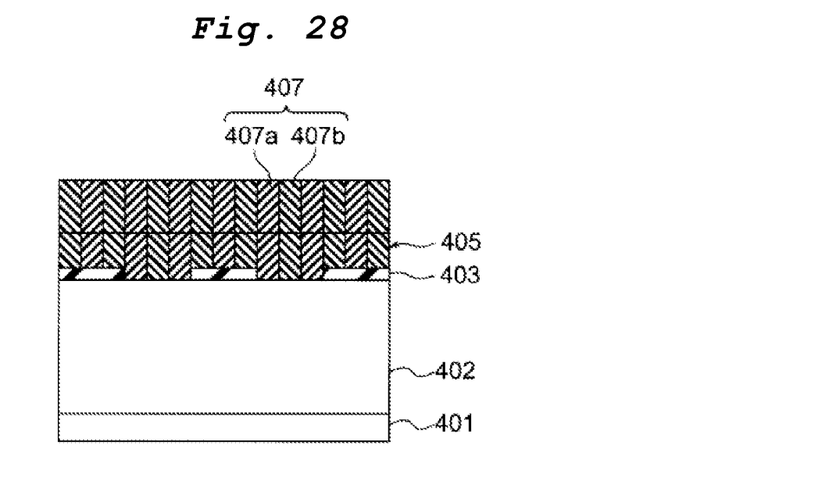
FIG. 28 is a cross-sectional view for explaining the process continued from FIG. 27.

Then, as shown in FIG. 28, the substrate 401 is kept on the hot plate and heated at 110° C. for 90 seconds. By doing so, the blended polymer layer 406 is turned in the form of the lamellar self-assembled pattern 405 of half pitch 15 nm in which a first polymer 407a and a second polymer 407b are mutually placed as a chemical guide.

The thickness of the blended polymer layer 406 formed in the process shown in FIG. 27 is small. Therefore, micro phase dissociation of the entire block copolymer 406 is done regularly in the process shown in FIG. 28, and the self-assembled pattern 407 can be obtained.

Further, while applying PGMEA solution (sixth solution) of the block copolymer on the self-assembled pattern 405, it is possible that the phase dissociation pattern of the self-assembled pattern 405 is dissolved by solvent (for instance, in this case, PGMEA). This problem can be solved by using the solvent type different from the fifth solution and the sixth solution that are applied in the process shown in FIG. 25. Further, the cross linking agent is added in the fifth solution and phase dissociation pattern of the self-assembled pattern 405 is formed. After that, it is cross linked then the sixth solution is applied. The problem mentioned above can even be solved by doing the above process. Whether to change the type of solvent or to add the cross linking agent in the solution is not limited to the fifth solution and the sixth solution, but can be used as needed in the further processes also, while repeatedly applying solution of polymer.

Figure 29:
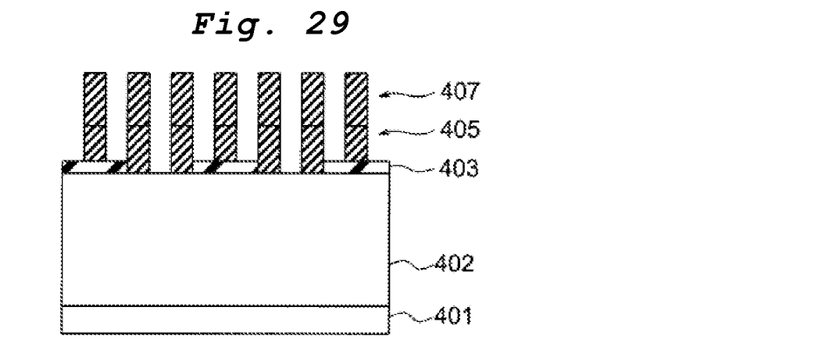
FIG. 29 is a cross-sectional view for explaining the process continued from FIG. 28.

Next, as shown in FIG. 29, as per the processing procedure, either of the first polymer or the second polymer (for instance, PS polymer phase of the self-assembled layer 405, PS polymer phase of the self-assembled layer 407) in the self-assembled layers 405, 407 is selectively removed and due to this, the line and space pattern can be obtained.

As the process selection ratio of PS and PDMS is larger than the process selection ratio of PS and PMMA, when PDMS is masked, the processing of PS can be easily conducted even if the thickness of the self-assembled layer is less, and thus the line and space pattern of high aspect ratio can be formed.

In this way, even if the blended polymer is used, the micro phase dissociation pattern of larger thickness can be formed. Since the thickness of micro phase dissociation pattern is more, sufficient processing resistance can be obtained at the time of processing of processed film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for pattern formation on a substrate, comprising:
    forming a first film on a substrate;
    forming a second film on the first film to form a pattern on the first film that has a plurality of projections and a plurality of depressions;
    forming a first copolymer layer on a surface of the plurality of depressions;
    forming a first polymer portion and a second polymer portion in the first copolymer layer, the first polymer portion and the second polymer portion being alternately formed along a first direction;
    forming a second copolymer layer on the first copolymer layer; and
    forming a third polymer portion and a fourth polymer portion in the second copolymer layer, wherein
    a pitch of the first polymer portion and the second polymer portion is about two times greater than a pitch of the third polymer portion and the fourth polymer portion.

2. The method of claim 1, wherein the first polymer portion and the third polymer portion comprise a first material, and the second polymer portion and the fourth polymer portion comprise a second material that is different than the first material, the method further comprising:
    selectively removing one of the first material and the second material.

3. The method of claim 1, wherein the second film comprises a resist material.

4. The method of claim 3, wherein each of the first copolymer layer and the second copolymer layer comprises a plurality of shaped regions aligned in the first direction, the shaped regions being selected from the group consisting of spherical shapes, cylindrical shapes, and combinations thereof.

5. The method of claim 1, further comprising:
    forming consecutive copolymer layers on the second copolymer layer.

6. The method of claim 5, wherein a total thickness of the first copolymer layer, the second copolymer layer, and the consecutive copolymer layers is equal to a thickness of the second film.

7. The method of claim 1, wherein the first polymer portion and the third polymer portion comprise a first material, and the second polymer portion and the fourth polymer portion comprise a second material that is different from the first material.

8. The method of claim 1, wherein the first film comprises a neutralized film.

9. The method of claim 8, wherein the first copolymer layer is formed on a surface of the plurality of projections.

10. The method of claim 9, further comprising:
    selectively removing one of the group of the first material and the second material.

11. The method of claim 8, wherein the first polymer portion and the third polymer portion comprise a first material, and the second polymer portion and the fourth polymer portion comprise a second material that is different from the first material.

12. A method for pattern formation, comprising:
    forming a first self-assembly material layer which includes a first segment and a second segment, on a substrate having an irregular guide layer;
    phase separating the first self-assembly material layer to form a first self-assembled pattern comprising a first area containing the first segment and a second area containing the second segment;
    forming a second self-assembly material layer which includes a third segment and a fourth segment, on the first self-assembled pattern;
    phase separating the second self-assembly material layer to form a second self-assembled pattern comprising a third area containing the third segment and a fourth area containing the fourth segment, wherein a pitch of first self-assembled pattern is n times a pitch of the second self-assembled pattern, n being an integer greater than two.

13. The method of claim 12, wherein the first segment and the third segment comprises the same polymer.

14. The method of claim 13, wherein the second segment and the fourth segment comprises the same polymer.

15. The method of claim 12, wherein:
the first area is a cylindrical shape or a spherical shape,
the second area is a continuous phase layer, and
the film thickness of the first self-assembly material layer has the level is the same as the diameter of first area.

* * * * *